United States Patent [19]

Yoder

[11] Patent Number: 4,495,511
[45] Date of Patent: Jan. 22, 1985

[54] PERMEABLE BASE TRANSISTOR STRUCTURE

[75] Inventor: Max N. Yoder, Falls Church, Va.

[73] Assignee: The United States of America as represented by the Secretary of the Navy, Washington, D.C.

[21] Appl. No.: 410,229

[22] Filed: Aug. 23, 1982

[51] Int. Cl.³ .............................................. H01L 29/80
[52] U.S. Cl. ....................................... 357/22; 357/15; 357/55
[58] Field of Search .................... 357/55, 22, 15, 22 G, 357/22 GR, 22 S

[56] References Cited

U.S. PATENT DOCUMENTS

| 3,855,608 | 12/1974 | George et al. | 357/22 |
| 4,262,296 | 4/1981 | Shealy et al. | 357/22 X |
| 4,326,209 | 4/1982 | Nishizawa et al. | 357/22 |
| 4,378,629 | 4/1983 | Bozler et al. | 148/1.5 X |
| 4,403,396 | 9/1983 | Stein | 357/15 X |

Primary Examiner—Andrew J. James
Assistant Examiner—William A. Mintel
Attorney, Agent, or Firm—Robert F. Beers; Kenneth E. Walden; John G. Wynn

[57] ABSTRACT

The performance of the conventional permeable base transistor (PBT) is improved by configuring its structure so as to eliminate excessive parasitic losses above and below its control grid structure, to eliminate excessive negative feedback in its source-grid (gate) region, and to eliminate the requirement for backfill of the trenches over the control grid structure. The improved PBT structure features, inter alia, a collector/anode/-drain structure comprising a plurality of Schottky metal contacts, and the aforementioned control grid structure comprising a plurality of Schottky metal control grid elements. Each of the plurality of Schottky metal control grid elements, after fabrication, is shaped like an inverted upper case letter T emplaced in corresponding ones of a plurality of trenches of the improved PBT structure.

10 Claims, 2 Drawing Figures

PERMEABLE BASE TRANSISTOR STRUCTURE

BACKGROUND OF THE INVENTION

1. Field of the Invention

The present invention relates to semiconductor device structures, but more specifically, the present invention relates to an improved permeable base transistor structure.

2. Description of the Prior Art

FIG. 1 is an isometric/cutaway view of a conventional permeable base transistor (PBT) structure 10. It may be thought of as a practical implementation of the metal base transistor or as a perfection of the gridistor of the 1960s. Conventional PBT structure 10 comprises a metal ohmic emitter/cathode/source contact 12, and a control grid structure 14 including a plurality of control grid fingers 16 and a control grid contact 18 integral thereto. Conventional PBT structure 10 further includes an n+GaAs substrate 20 upon which a collector-/anode/drain region 22 of n-type semiconductor material is grown (epitaxially deposited) over the plurality of control grid fingers 16 of the control grid structure 14. Finally, collector/anode/drain ohmic contact 24 is fixed to the top of collector/anode/drain region 22, aforementioned. A model developed for conventional PBT structure 10 has shown it to be superior, in amplifier applications, to all other three terminal solid state structures. The model predicts operation to frequencies exceeding 200 GHz. While operation has been reported at K-band frequencies, this performance has not been reproducible and prospects for reaching 100 GHz with the present structure are not promising.

It has been determined that a significant part of the difficulty experienced has been due to the quality of the semiconductor material immediately adjacent to the control grid structure 14. To overcome this problem, attempts have been made to grow the entire semiconductor portion of the device, etch deep "trenches" for the grid, deposit the grid metal in the bottom of the trenches, cover the grid and fill the trenches with semiconductor material, and deposit an ohmic contact. Results, to date have not been promising. Other approaches simply do not bother to backfill the trenches above the grid metal, and, consequentially, the resultant structure is a vertical channel transistor.

Still referring to FIG. 1, a current version of conventional PBT structure 10 uses semiconductor material such as epitaxially deposited GaAs 26 of the same conductivity on both sides (lower and upper) of control grid fingers 16 grown on n+GaAs substrate 20. To ensure a reasonable depletion depth adjacent to control grid fingers 16, the semiconductor doping density must not exceed $5 \times 10^{16}$ cm$^{-3}$. While this doping density is nearly ideal for the region between control grid fingers 16 and collector/anode/drain ohmic contact 24, it introduces excessive resistance in the channel region between control grid fingers 16, and metal ohmic emitter/cathode/source contact 12. This resistance introduces negative feedback and lowers the gain of any device fabricated according to conventional PBT structure 10. Increasing the doping density in the aforementioned channel region in order to reduce negative feedback has a counterproductive effect, i.e., parasitic losses increase in the region of control grid fingers 16.

The region immediately above each one of the plurality of control grid fingers 16 has typically been backfilled with polycrystalline GaAs (not shown) so as to ease the task of applying an ohmic contact such as collector/anode/drain ohmic contact 24. Without the polycrystalline GaAs backfill, the ohmic contacting material tends to short out control grid fingers 16. This backfill material, however, introduces parasitic losses by virtue of its immediate proximity to control grid fingers 16.

While control grid parasitics and the excessive negative feedback in the channel region between control grid fingers 16 and metal ohmic emitter/cathode/source contact 12 will probably preclude further performance improvements in conventional PBT structure 10, its basic geometry consumes less than 1/16 of the GaAs "real estate" required of an FET with similar control circuit periphery. This aspect is particularly relevant for operation at frequencies above 20 GHz where present planar FET structures require control gate lateral dimensions which are significant portions of a wavelength.

OBJECTS OF THE INVENTION

Accordingly, an important object of the present invention is to eliminate the excessive parasitic losses above and below the control grid fingers (structure) in order to improve the performance of the conventional PBT.

Another important object of the present invention is to eliminate the excessive negative feedback in the channel region between the control grid fingers and the metal ohmic emitter/cathode/source contact in order to improve the performance of the conventional PBT.

Yet another important object of the present invention is to eliminate the requirement for the polycrystalline GaAs backfill over the control grid fingers necessitated in part by ohmic contact processing compatibility.

SUMMARY OF THE INVENTION

In accordance with the above stated objects, other objects, features and advantages, the present invention has as a primary purpose to improve the basic design of the conventional PBT in order to improve its overall performance.

The essence of the present invention is in configuring an improved permeable base transistor (PBT) structure which eliminates the conventional PBT structure factors which inhibit performance.

The purpose of the present invention is carried out by fabricating the improved PBT structure to include an n-type semiconductor material grown on an n+-type semiconductor material substrate so as to configure a plurality of trenches therein for subsequent emplacement of a control grid structure contiguous to a plurality of implantation regions at the bottom of the trenches after bombardment thereof with, for example, energetic oxygen ions so as to render the plurality of implantation regions semi-insulating. After fabrication, the control grid structure comprises a plurality of Schottky metal control grid elements each being shaped like an inverted upper case letter T, and a collector/anode/drain structure including a plurality of Schottky metal collector/anode/drain contacts which are deposited (evaporated or sputtered) onto the n-type semiconductor material at the top surface thereof and contiguous thereto during the fabrication of the control grid structure. The improved PBT structure is completed by fashioning on the bottom of the n+-type semiconductor material substrate a metal ohmic emitter/cathode/source contact.

BRIEF DESCRIPTION OF THE DRAWINGS

The previously stated objects, other objects, features and advantages of the present invention will be apparent from the following more particular description of the preferred embodiment as illustrated in the accompanying drawings, in which.

DESCRIPTION OF THE PREFERRED EMBODIMENT

Figure 1:
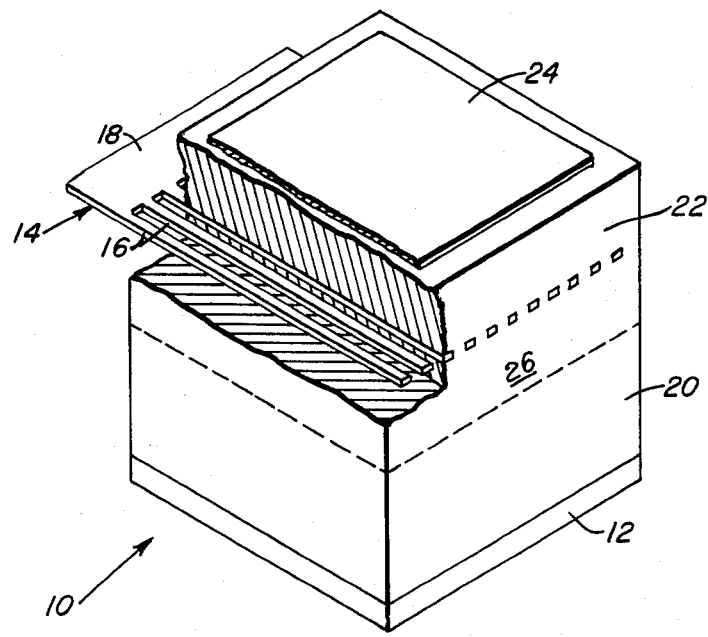
FIG. 1 is an isometric/cutaway view of a conventional permeable base transistor (PBT) structure.

An improvement to the conventional PBT structure 10 shown in FIG. 1, and previously described in the "Background of the Invention" section of the present application, can be made by first realizing that the collector/anode/drain ohmic contact 24 thereof is always "forward biased" in the sense that its potential is never lower than that of control grid contact 18. Thus, the need for an ohmic contact does not exist and a Schottky metal contact will perform quite satisfactorily. The advantages of a Schottky refractory metal contact are numerous. Among them are (a) it can be deposited during the deposition of the control grid structure, (b) there is no 385° C. limitation for performance operation as there would be when conventional alloyed ohmic contacts are used, (c) there are no complications due to the possibility of shorting out control grid fingers 16, and hence the need for a GaAs backfill of the trenches is eliminated (not shown in FIG. 1), and (d) the reliability of the Schottky refractory metal contact is superior to that of an alloyed ohmic contact. In this regard, it should also be pointed out that conventional PBT structure 10 inherently encourages uniform collection of electrons and does not induce edge mode crowding of drain current as does a planar FET.

Figure 2:
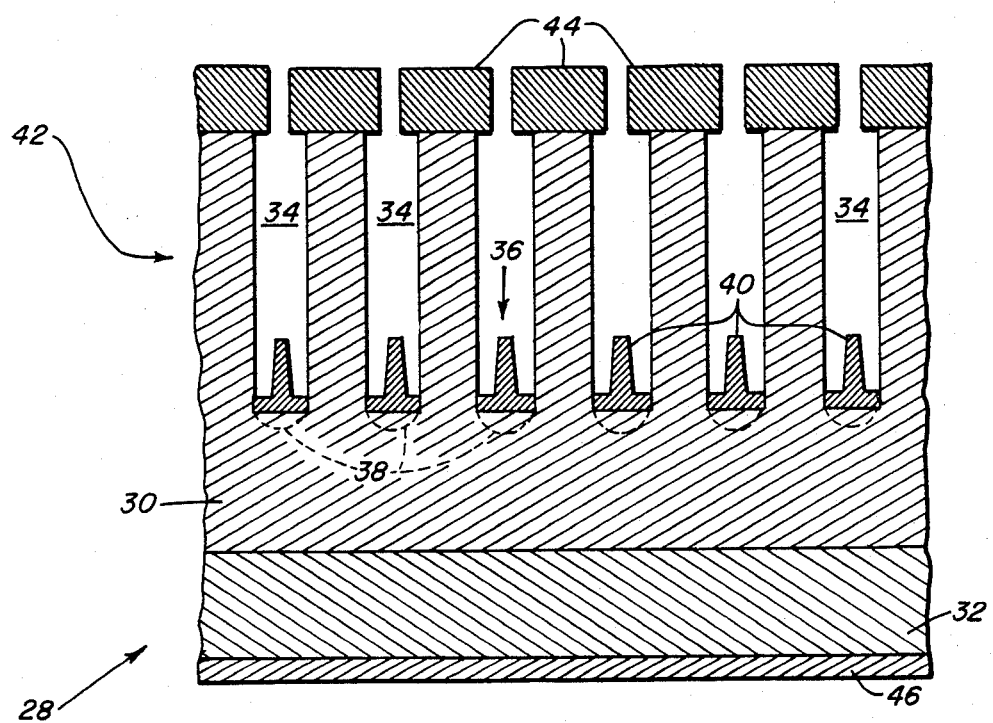
FIG. 2 is a cross-sectional view, in elevation, of an improved version of the conventional PBT structure of FIG. 1, according to the present invention.

Referring now to FIG. 2, an improved PBT structure 28 is disclosed. It includes an n-type semiconductor material 30 grown on an n+-type semiconductor material substrate 32 so as to configure a plurality of trenches 34 therein for subsequent emplacement of a control grid structure 36 after bombardment of the bottom of plurality of trenches 34 with, for example, energetic oxygen ions in a plurality of implantation regions 38 so as to render the aforementioned regions semi-insulating. Control grid structure 36 includes a plurality of Schottky metal control grid elements 40. As depicted, after fabrication, each of control grid elements 40 is shaped like an inverted upper case letter T. Improved PBT structure 28 further comprises a collector/anode/drain structure 42 including a plurality of Schottky metal collector/anode/drain contacts 44 which are put down during the fabrication of control grid structure 36, aforementioned. A metal ohmic emitter/cathode/source contact 46 is fashioned on the bottom of n+-type semiconductor material substrate 32 to complete improved PBT structure 28.

In fabricating a device according to improved PBT structure 28 of FIG. 2, one must first determine a technique for reducing the excessive parasitic losses that the higher conductivity semi-conducting material used therein may otherwise create. In GaAs semiconductor material, this may be accomplished by choosing the dominant donor impurity in the source-gate (grid) region as silicon and then bombarding plurality of implantation regions 38 at the bottom of plurality of trenches 34 with energetic oxygen ions, as aforementioned. This will lower the net carrier concentration (in regions 38 immediately beneath the subsequently emplaced plurality of control grid elements 40) to the vicinity of $10^{10} cm^{-3}$, i.e., render regions 38 semi-insulating. Doubly ionized oxygen at 400 KeV and a fluence of $2 \times 10^{12}/cm^2$ should be followed by a similar fluence of singly ionized oxygen at 100 KeV for optimum reults. After processing at 850° C. for 20 minutes, the resistivity of plurality of implantation regions 38 will be in the vicinity of $10^9$ ohm-cm. The collector/anode/drain region (top portion of n-type semiconductor material 30) must be protected during this oxygen implantation step. With this procedure, the silicon donor concentration of n-type semiconductor material 30 between metal ohmic emitter/cathode/source contact 46 and plurality control grid 40 elements can be optimized. A nominal optimized concentration value is $1.5 \times 10^{17} cm^{-3}$. This concentration will significantly enhance the gain of improved PBT structure 28 by eliminating negative feedback.

In silicon PBTs, a different but analogous approach may be taken to increase the source-gate (grid) region carrier concentration while insulating plurality of implantation regions 38 immediately beneath corresponding plurality of control grid elements 40. The technique is to use boron ions for bombardment of plurality of implantation regions 38 to be followed by an etching to render the region porous and finally an oxidation of the porous region. The silicon dioxide created immediately beneath the subsequently applied plurality of control grid elements 40 should possess a resistivity at least 1000 times higher than that produced in the aforementioned oxygen bombarded GaAs approach.

To provide for large voltage swings (e.g., high power operation), the impurity concentration in collector/anode/drain structure 42 should be lower than that in the portions of n-type semiconductor material 30 below the plurality of control grid elements 40. A nominal impurity concentration value is $5 \times 10^{16} cm^{-3}$.

"Plating-up" of control grid structure 36 and collector/anode/drain contacts 44 will also reduce losses in the device. This may be accomplished by first evaporating from a non-laminar source followed by an evaporation from a laminar source. The narrow (e.g., 1200–1500 Å) openings at the top of each one of plurality of trenches 34 will tend to close over after about 1500 Å evaportation from a conventional non-laminar source. To improve the conductivity of control grid structure 36 and of collect/anode/drain contacts 44 the first (i.e., refractory metal) evaporization must be stopped after about 750–1000 Å thickness is achieved and the openings at the top of each one of plurality of trenches 34 have begun to pinch closed by edge overgrowth. At this point improved PBT structure 28 is further exposed to additional metallization from a laminar source. No further closings will occur and conductivity of control grid structure 36 and of collector/anode/drain contacts 44 may be improved by the thicker metallization thus achieved. It should be noted that the thicker metallization of plurality of control grid elements 40 does not extend to the edges of plurality of trenches 34, but only accumulates in the center thereof, and, accordingly, in the center of each one of plurality of control grid elements 40. Thus, the edges of each one of plurality of control grid elements 40 remain very thin thereby creating the maximum electric filed strengths thereat. As depicted in FIG. 2, the physical shape of control grid elements 40 thus produced are in the shape of an inverted upper case letter T as aforementioned.

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. An improved permeable base transistor (PBT) structure comprising:
   an $n^+$-type semiconductor material substrate;
   a metal ohmic emitter/cathode/source contact fashioned to the bottom of said $n^+$-type semiconductor material substrate;
   an n-type semiconductor material epitaxially grown on the top of said $n^+$-type semiconductor material substrate so as to configure a plurality of trenches in said n-type semiconductor material, said n-type semiconductor material including a plurality of implantation regions fashioned therein at the bottom of corresponding ones of said plurality of trenches, said implantation regions being formed after bombardment of said n-type semiconductor material with ions selected to render said implantation regions semi-insulating;
   a control grid structure including a plurality of Schottky metal control grid elements operatively emplaced contiguously to corresponding ones of said plurality of implantation regions; and
   a collector/anode/drain structure including a plurality of Schottky metal collector/anode/drain contacts deposited on the top surface of said n-type semiconductor material, said collector/anode/drain contacts being deposited during the fabrication of said control grid structure.

2. The improved structure of claim 1 wherein each one of said plurality of Schottky metal control grid elements, after fabrication, is configured like an inverted upper case letter T thereby remaining thin relative to the width of corresponding ones of said plurality of trenches at the tops thereof.

3. The improved structure of claim 2 wherein the widths of corresponding ones of said plurality of trenches at the tops thereof, after fabrication, are in the range of 1200–1500 Å.

4. The improved structure of claim 3 wherein said $n^+$-type semiconductor material substrate comprises GaAs.

5. The improved structure of claim 4 wherein said n-type semiconductor material epitaxially grown on the top of said $n^+$-type semiconductor material substrate is GaAs, and wherein the dominant donor impurity chosen for the sourcegrid (gate) region is silicon.

6. The improved structure of claim 5 wherein said ions selected are energetic oxygen ions.

7. The improved structure of claim 4 where said $n^+$-type semiconductor material substrate comprises silicon.

8. The improved structure of claim 7 wherein said n-type semiconductor material epitaxially grown on the top of said $n^+$-type semiconductor material substrate comprises silicon.

9. The improved structure of claim 8 wherein said ions selected are boron ions.

10. The improved structure of claim 9 wherein the bombardment of said plurality of implantation regions with said boron ions is followed by an etching so as to render said plurality of implantation regions porous, and wherein the etching is followed by an oxidation of the porous regions thereby producing silicon dioxide thereat.

* * * * *